(12) United States Patent
Rottner et al.

(10) Patent No.: US 11,961,940 B2
(45) Date of Patent: Apr. 16, 2024

(54) OPTOELECTRONIC DEVICE WITH PN JUNCTION AND TRENCH GATE

(71) Applicant: Commissariat à l'Energie Atomique et aux Energies Alternatives, Paris (FR)

(72) Inventors: Jean Rottner, Grenoble (FR); Helge Haas, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 374 days.

(21) Appl. No.: 17/309,766

(22) PCT Filed: Dec. 18, 2019

(86) PCT No.: PCT/FR2019/053175
§ 371 (c)(1),
(2) Date: Jun. 17, 2021

(87) PCT Pub. No.: WO2020/128340
PCT Pub. Date: Jun. 25, 2020

(65) Prior Publication Data
US 2022/0059725 A1 Feb. 24, 2022

(30) Foreign Application Priority Data
Dec. 20, 2018 (FR) ..................... 1873672

(51) Int. Cl.
*H01L 33/32* (2010.01)
*H01L 33/00* (2010.01)
*H01L 33/62* (2010.01)

(52) U.S. Cl.
CPC .......... *H01L 33/32* (2013.01); *H01L 33/0095* (2013.01); *H01L 33/62* (2013.01)

(58) Field of Classification Search
CPC ...... H01L 33/32; H01L 33/0095; H01L 33/62
See application file for complete search history.

(56) References Cited

U.S. PATENT DOCUMENTS

2009/0184337 A1 7/2009 Fan et al.
2013/0161705 A1 6/2013 Disney et al.
(Continued)

FOREIGN PATENT DOCUMENTS

EP 2642533 A2 9/2013

OTHER PUBLICATIONS

Translation of the Written Opinion of the International Search Authority for International Application No. PCT/FR2019/053175, 5 pages.

(Continued)

*Primary Examiner* — Michael Jung
(74) *Attorney, Agent, or Firm* — Jordan IP Law, LLC

(57) ABSTRACT

The present description concerns an optoelectronic device (300) including: a vertical stack of first (101) and second (105) semiconductor layers forming a PN junction, and of a third conductive layer (107) arranged on top of and in contact with the surface of the second layer opposite to the first layer; a peripheral trench (110) crossing the third (107) and second (105) layers, said trench laterally delimiting a portion of the third layer (107) and a portion of the second layer (105); in said trench (110), a conductive spacer (301) in contact with a lateral side of said portion of the third layer (107); and in said trench (110), an insulated conductive gate (113, 111) extending against a lateral side of the conductive spacer (301) and against a lateral side of said portion of the second layer.

12 Claims, 2 Drawing Sheets

(56) References Cited

U.S. PATENT DOCUMENTS

2016/0322538 A1    11/2016  Einfeldt et al.
2017/0288050 A1*   10/2017  Ueno .................. H01L 29/0661
2017/0309676 A1    10/2017  Odnoblyudov et al.
2017/0309713 A1*   10/2017  Hirler ................. H01L 29/7806

OTHER PUBLICATIONS

International Search Report for International Application No. PCT/FR2019/053175 dated Feb. 25, 2020, 2 pages.
Translation of the Written Opinion of the International Search Authority for International Application No. PCT/FR2019/053174 dated Mar. 3, 2020, 5 pages.
International Search Report for International Application No. PCT/FR2019/053174 dated Mar. 3, 2020, 2 pages.

\* cited by examiner

OPTOELECTRONIC DEVICE WITH PN JUNCTION AND TRENCH GATE

FIELD

The present disclosure concerns the field of optoelectronic devices with a PN junction such as light-emitting diodes (LED) or photodiodes.

BACKGROUND

Patent application EP2960951 (DD14957) previously filed by the applicant describes PN junction optoelectronic devices provided with an insulated conductive gate coating a lateral side of at least one of the semiconductor regions forming the PN junction.

The application of a potential on the conductive gate creates an electric field enabling to improve the injection of charge carriers into the junction, and accordingly the conversion efficiency of the device.

It would be desirable to at least partly improve certain aspects of optoelectronic devices of this type.

SUMMARY

For this purpose, an embodiment provides an optoelectronic device comprising:
a vertical stack of a first doped semiconductor layer of a first conductivity type, of a second doped semiconductor layer of the second conductivity type forming with the first layer a PN junction, and of a third conductive layer arranged on top of and in contact with the surface of the second layer opposite to the first layer;
a peripheral trench crossing the third and second layers, said trench laterally delimiting a portion of the third layer and a portion of the second layer;
in said trench, a conductive spacer in contact with a lateral side of said portion of the third layer; and
in said trench, an insulated conductive gate comprising a gate insulator layer extending on top of and in contact with a lateral side of the conductive spacer and on top of and in contact with a lateral side of said portion of the second layer, and a conductive gate layer arranged on top of and in contact with the surface of the gate insulator layer opposite to the conductive spacer and to said portion of the second layer.

According to an embodiment, the conductive spacer is made of a material different from that of the third layer.

According to an embodiment, the conductive spacer is made of metal.

According to an embodiment, the conductive spacer is made of a metal from the group comprising platinum, nickel, and tungsten.

According to an embodiment, the third layer is made of aluminum or of silver.

According to an embodiment, the device further comprises a connection metallization in contact with the first semiconductor layer.

According to an embodiment, the connection metallization is electrically insulated from the conductive gate.

According to an embodiment, the connection metallization is electrically connected to the insulated conductive gate.

According to an embodiment, the device further comprises an emissive semiconductor layer between the first and second semiconductor layers, the peripheral trench crosses the emissive semiconductor layer, the trench laterally delimiting a portion of the emissive semiconductor layer, and the insulated conductive gate extending against a lateral side of said portion of the emissive semiconductor layer.

According to an embodiment, each of the first and second semiconductor layers is made of a III-N compound.

Another embodiment provides a method of manufacturing an optoelectronic device such as defined hereabove, comprising the successive steps of:
a) providing a stack comprising the first, second, and third layers;
b) forming a peripheral trench crossing the third layer and stopping on the second layer, said trench laterally delimiting said portion of the third layer;
c) forming in said trench a conductive spacer in contact with the sides of said portion of the third layer;
d) continuing said trench through the second layer, said continued trench laterally delimiting said portion of the second layer; and
e) forming in said trench the insulated conductive gate.

According to an embodiment, the method further comprises, after step d) and before step e), a step of chemical cleaning of the exposed surfaces of the first layer inside of the trench.

According to an embodiment, the chemical cleaning step is carried out by means of a solution based on potassium hydroxide or of a solution based on tetramethylammonium hydroxide or of a solution based on tetraethylammonium hydroxide.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

Unless specified otherwise, the expressions "around", "approximately", "substantially" and "in the order of" signify within 10%, and preferably within 5%.

Figure 1:
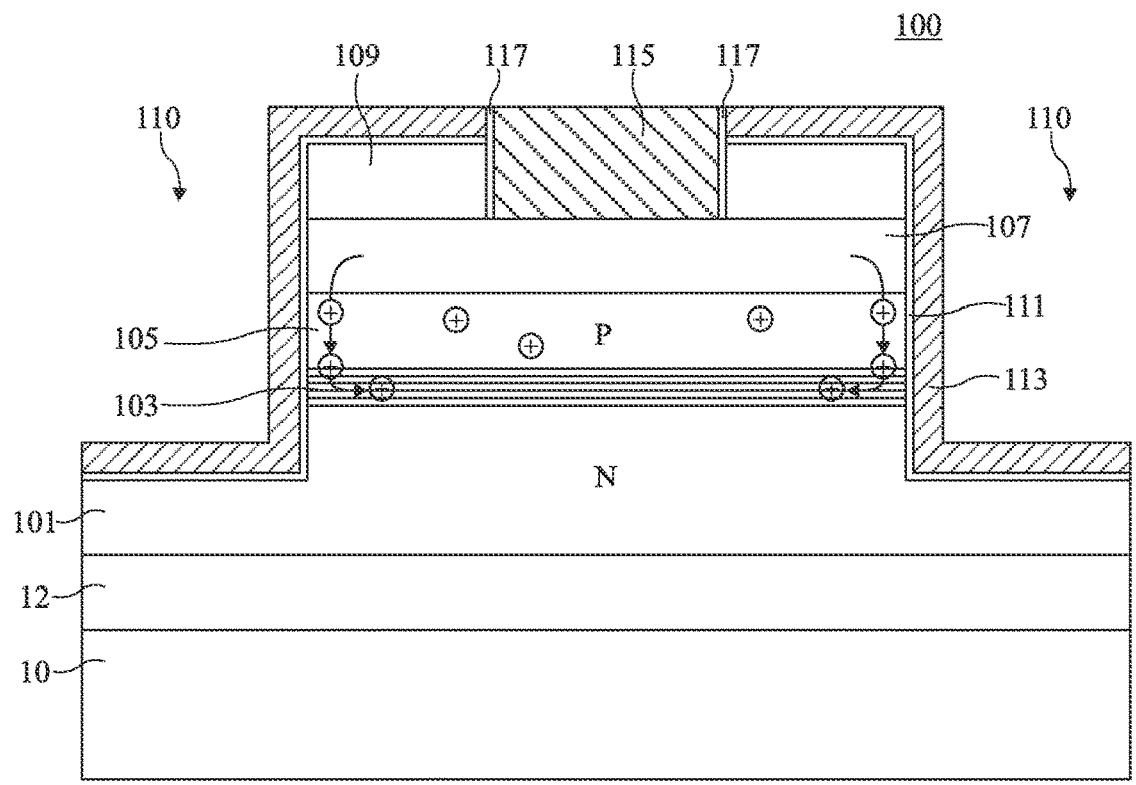
FIG. 1 is a partial simplified cross-section view illustrating an example of a PN-junction optoelectronic device provided with an insulated conductive gate.

FIG. 1 is a partial simplified cross-section view illustrating an example of a PN-junction optoelectronic device 100 provided with an insulated conductive gate.

The device 100 of FIG. 1 is a light-emitting diode (LED) comprising a vertical stack of an N-type semiconductor layer 101, of an emissive layer 103 coating the upper surface of layer 101, for example, in contact with the upper surface of layer 101, and of a P-type semiconductor layer 105 coating the upper surface of emissive layer 103, for example, in contact with the upper surface of emissive layer 103. The PN junction of the LED is defined by layers 105 and 101, which respectively form the anode region and the cathode region of the LED. More particularly, in this example, the PN junction of the LED is a P-i-N-type junction, considering the intermediate emissive layer 103 separating P-type layer 105 from N-type layer 101.

Each of semiconductor layers 101 and 105 may be made of a III-N compound, for example, of the same III-N compound respectively N-type doped for layer 101 and P-type doped for layer 105. The term III-N compound here designates a composite semiconductor material comprising nitrogen (N), associated with one or a plurality of elements of column III of the periodic table of elements, for example, gallium (Ga), aluminum (Al), and/or indium (In). As an example, the term III-N compound here designates a semiconductor material from the group comprising gallium nitride (GaN), indium gallium nitride (InGaN), aluminum nitride (AlN), aluminum-gallium nitride (AlGaN), and indium gallium aluminum nitride (InGaAlN). As an example, pads 101 and 105 are made of AlGaN.

Emissive layer 103 may comprise confinement means corresponding to multiple quantum wells. As an example, layer 103 comprises an alternation of semiconductor layers of a first III-N compound and of semiconductor layers of a second III-N compound, each layer of the first compound defining a quantum well and being sandwiched between two layers of the second compound, the first compound having a band gap different from that of the second compound.

In the shown example, layers 101, 103, and 105 rest on a support substrate 10, for example, made of sapphire, a buffer layer 12 forming an interface between support substrate 10 and the lower surface of layer 101. Buffer layer 12 and layers 101, 103, and 105 are for example successively formed by epitaxy from the upper surface of substrate 10.

In this example, the active portion of LED 100 is laterally delimited by a peripheral trench 110 vertically extending from the upper surface of layer 105 down to layer 101. In the shown example, trench 110 extends vertically down to an intermediate level in layer 101. As a variant, trench 110 stops on the upper surface of layer 101. Thus, the active portion of LED 100 forms, in the stack of layers 105, 103, and optionally 101, a pad-shaped island or mesa laterally delimited by trench 110.

The LED 100 of FIG. 1 comprises an anode contact metallization 107 arranged on top and in contact with the upper surface of layer 105, in the active portion of the LED. As an example, metallization 107 extends over the entire surface of layer 105 in the active portion of the LED. Metallization 107 is preferably made of a metal reflective in the wavelength range of the LED, for example, made of aluminum. In this example, the LED is intended to emit light from its lower surface (through buffer layer 12 and support substrate 10).

In the example of FIG. 1, LED 100 further comprises a hard mask layer 109 made of an insulating material, for example, made of silicon oxide, coating the upper surface of metallization 107 in the active portion of the LED. Layer 109 is used as a masking layer protecting the active portion of the LED during the forming of peripheral trench 110. In the shown example, masking layer 109 is not removed at the end of the etching of trench 110 and thus remains in the final LED.

The LED 100 of FIG. 1 further comprises a cathode contact metallization (not shown in the drawing) in contact with layer 101. As an example, the cathode contact metallization may be arranged on top of and in contact with the upper surface of layer 101 at the bottom of peripheral trench 110.

The LED 100 of FIG. 1 further comprises, on the lateral walls of peripheral trench 110, an insulated conductive gate coating the sides of the active portion of the LED. More particularly, the insulated conductive gate comprises a gate insulator layer 111, for example, made of silicon oxide or of alumina (Al2O3), arranged on top of and in contact with the lateral sides of layers 101, 103, and 105 and of metallization 107, and a conductive gate layer 113, for example, a metal layer, arranged on top of and in contact with the surface of layer 111 opposite to layers 101, 103, 105, and 107. Gate conductive layer 113 is electrically insulated from anode contact metallization 107 and from the cathode contact metallization (not shown) of the LED.

In the example of FIG. 1, layers 111 and 113 further extend over the sides of the hard masking layer 109 coating metallization 107. Further, in this example, layers 111 and 113 further extend over a peripheral portion of the upper surface of layer 109 in the active portion of the LED, and over the upper surface of layer 101 in the peripheral portion of the LED (at the bottom of trench 110).

In this example, LED 100 further comprises, opposite its active portion, a connection metallization 115 arranged in an opening crossing layers 113, 111, and 109, metallization 115 being in contact, by its lower surface, with the upper surface of anode contact metallization 107. Metallization 115 is insulated from conductive gate layer 113 by an insulating spacer 117 and enables to take an electric contact on metallization 107.

To emit light, a positive voltage is applied between anode contact metallization 107 and the cathode contact metallization (not shown) of the LED. Further, in this example, a negative potential with respect to the potential of the cathode contact metallization is applied to gate 113. This results in an accumulation of holes at the level of the sides of the P-type layer 105 of the LED, resulting in the forming of a hole channel in the vicinity of the sides of the P layer. This enables to ease the injection of holes into the emissive layer 103 of the LED, and thus to improve the light conversion efficiency of the LED.

The manufacturing of the LED 100 of FIG. 1 may comprise the successive steps of:

epitaxial deposition of successive layers 12, 101, 103, and 105 on the upper surface of support substrate 10;

deposition of a metal layer, for example, made of aluminum, over the entire upper surface of the stack, for the forming of the anode contact metallization 107 of the LED;

forming of hard mask 109 on the upper surface of the metal layer, opposite the active portion of the LED;

forming of trenches 110 by etching of layers 107, 105, 103, and, optionally, 101, to laterally delimit the active portion of the LED; and deposition of gate insulator layer 111 and then of conductive gate layer 113 over the entire upper surface of the structure, that is, at the bottom and on the lateral walls of trench 110 in the peripheral portion of the LED, and on the upper surface of layer 109 in the active portion of the LED.

Gate insulator layer 111 is preferably deposited by a conformal deposition method, for example, by deposition in successive atomic layers or ALD ("Atomic Layer Deposition"). As an example, gate insulator layer 111 is selected to resist to an electric field of at least 10 MV/cm. As an example, layer 111 is made of alumina ($Al_2O_3$). As an example, the thickness of layer 111 is in the range from 2 to 100 nm.

A step of local removal of layers 113, 111, and 109 opposite at least a portion of anode contact metallization 107 may further be provided to allow the taking of an electric contact on metallization 107, via connection metallization 115.

In this example, the forming of the cathode contact metallization of the LED has not been detailed. As an example, a local removal of layers 111 and 113 from the bottom of trench 110 may be provided to allow the taking of an electric contact on the upper surface of cathode layer 101, via a metallization, not shown. As a variant, the cathode contact metallization may be formed before the deposition of layers 111 and 113.

In practice, a plurality of identical or similar LEDs may be simultaneously formed inside and on top of the active LED stack formed by layers 101, 103, and 105, for example to form a LED emissive micro-display.

The etching of semiconductor layers 105, 103, and optionally 101 to form trench 110 is a dry etching, for example, a plasma etching. A problem which is posed is that, at the end of this etching, the sides of semiconductor layers 105, 103, and optionally 101, of the active portion of the LED may be superficially damaged. This may result in significantly degrading the conductivity of the hole channel induced by the application of a negative potential on conductive gate 113.

To overcome this disadvantage, a possibility is to provide, after the dry etch step, a cleaning of the sides of semiconductor layers 101, 103, and 105, by means of a wet chemical etch solution, for example, a solution based on potassium hydroxide (KOH) or of a solution based on tetramethylammonium hydroxide (TMAH), or of a solution based on tetraethylammonium hydroxide (TEAH), or any other solution capable of etching the III-N compound(s) forming layers 101, 103, and 105.

However, this chemical cleaning may result in damaging the sides of the anode contact metallization 107 of the LED, which may in particular result in decreasing the contact surface area between metallization 107 and anode layer 105, and thus in decreasing the efficiency of the LED.

Figure 2:
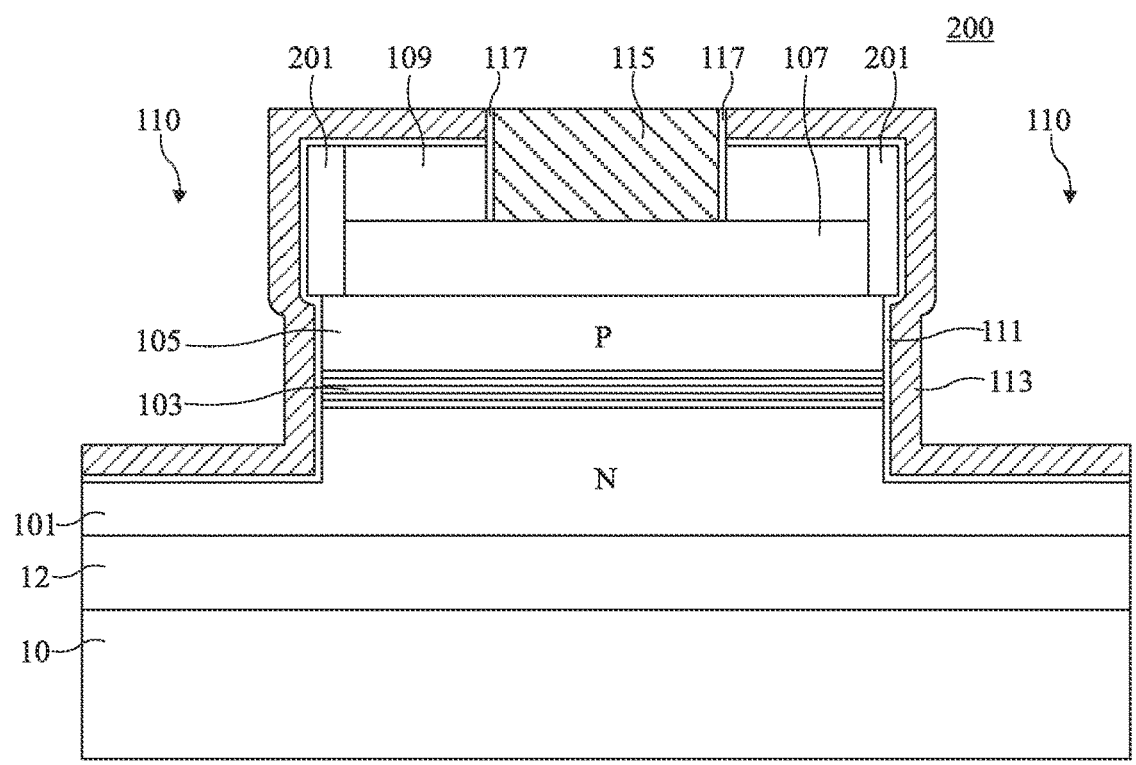
FIG. 2 is a partial simplified cross-section view illustrating another example of a PN-junction optoelectronic device provided with an insulated conductive gate.

FIG. 2 is a partial simplified cross-section view illustrating another example of a PN junction optoelectronic device 200 provided with an insulated conductive gate.

The device 200 of FIG. 2 is a light-emitting diode (LED) which differs from LED 100 mainly in that, in LED 200, a peripheral spacer 201 made of an insulating material, for example, silicon oxide, coats the sides of anode contact metallization 107, separating the sides of anode contact metallization 107 from gate insulator layer 11 and from conductive gate 113.

The manufacturing of the LED 200 of FIG. 2 may comprise the successive steps of:

epitaxial deposition of successive layers 12, 101, 103, and 105 on the upper surface of support substrate 10;

deposition of a metal layer, for example, made of aluminum, over the entire upper surface of the stack, for the forming of the anode contact metallization 107 of the LED;

forming of hard mask 109 on the upper surface of the metal layer, opposite the active portion of the LED;

partial forming of trenches 110 by etching from the upper surface of the metal layer, down to the upper surface of semiconductor layer 105, to laterally delimit the anode contact metallization 107 of the LED;

forming of an insulating spacer 201, for example, made of silicon oxide, in contact with the sides of anode contact metallization 107 all over the periphery of metallization 107 in this example, spacer 201 also extends on top of and in contact with the sides of hard mask layer 109;

extension of trenches 110 by dry etching, for example, by plasma etching, at least down to the upper surface of layer 101, to delimit the active portion of the LED during this step, the portions of layers 105, 103 and, optionally, 101, located under spacer 201, are not etched;

chemical cleaning of the surfaces of semiconductor layers 101, 103, and 105 exposed at the end of the dry etch step, for example, by means of a solution based on KOH, on TMAH, or on TEAH, or by means of any other solution capable of etching the III-N compound(s) forming layers 101, 103, and 105; and deposition of gate insulator layer 111 and then of conductive gate layer 113 over the entire upper surface of the structure, that is, at the bottom and on the lateral walls of trench 110 and on the upper surface of contact metallization 107, in the active portion of the LED.

As in the example of FIG. 1, gate insulator layer 111 is preferably deposited by a conformal deposition method, for example, by ALD. As an example, gate insulator layer 111 is selected to resist to an electric field of at least 10 MV/cm. As an example, layer 111 is made of alumina ($Al_2O_3$). As an example, the thickness of layer 111 is in the range from 2 to 100 nm.

Similarly to what has been described in relation with FIG. 1, a step of local removal of layers 113, 111, and 109 opposite at least a portion of anode contact metallization 107 may be provided to allow the taking of an electric contact on metallization 107, via a connection metallization 115.

Further, the cathode contact metallization of the LED (not shown in FIG. 2) may be formed similarly to what has been described in relation with FIG. 1.

In the example of FIG. 2, the step of chemical etching of the exposed surfaces of semiconductor layers 105, 103, and 101 inside of trench 110 enables to remove the semiconductor material surface film possibly damaged during the step of dry etching of trench 110. Spacer 201 enables to protect the sides of anode contact metallization 107 during the chemical cleaning step. Preferably, the etching time is adapted so that the thickness of semiconductor material removed from the sides of the active portion of the LED is smaller than the thickness of spacer 201, to avoid reaching layer 107.

Thus, a good quality interface is obtained between gate insulator layer 111 and the sides of the semiconductor layers of the active portion of the LED, while preserving the integrity of the sides of the anode contact metallization 107 of the LED.

However, a disadvantage of the LED of FIG. 2 is that spacer 201 draws the anode contact metallization 107 of the LED away from conductive gate 113. This makes the forming, in anode layer 105, of a hole conduction channel from metallization 107 to emissive layer 103 more difficult.

Figure 3:
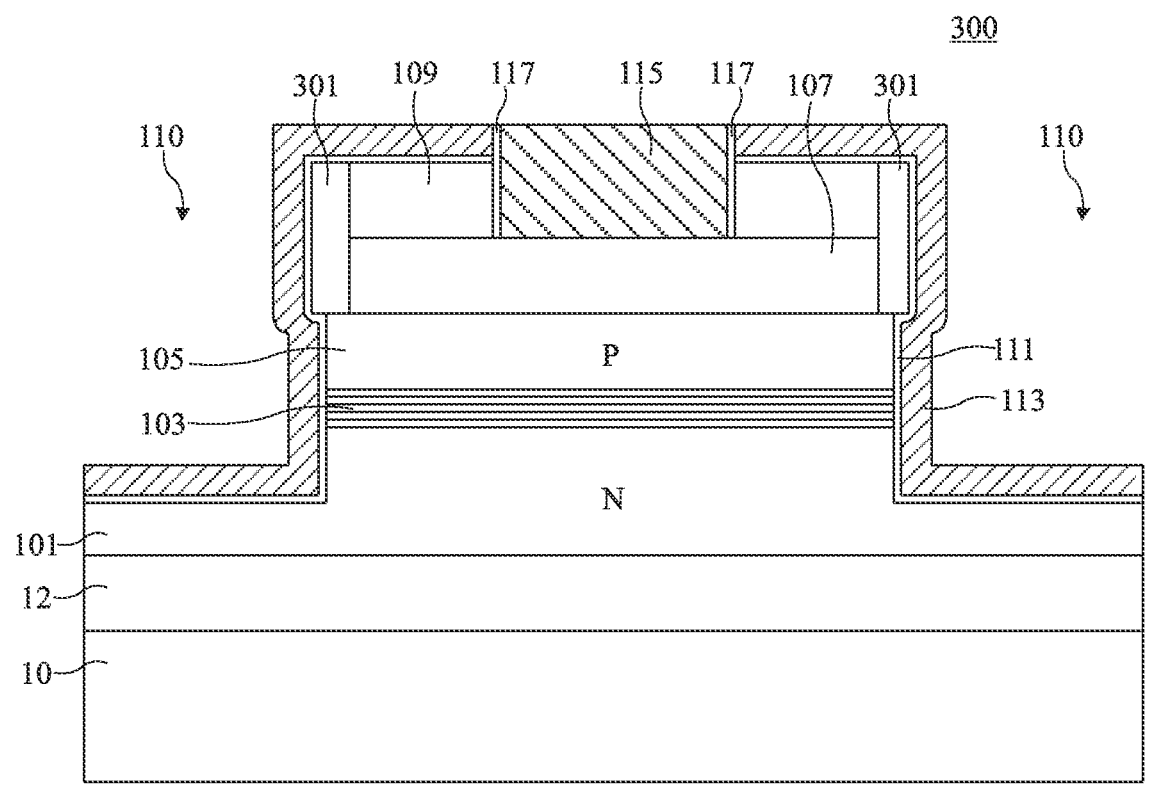
FIG. 3 is a partial simplified cross-section view illustrating an example of a PN-junction optoelectronic device provided with an insulated conductive gate according to an embodiment.

FIG. 3 is a partial simplified cross-section view illustrating an example of a PN-junction optoelectronic device 300 provided with an insulated conductive gate according to an embodiment.

The device 300 of FIG. 3 is a light-emitting diode (LED) which differs from the LED 200 of FIG. 2 mainly in that, in LED 300, the insulating spacer 201 of LED 200 is replaced with a spacer 301 made of a conductive material, for example, of metal. Spacer 301 forms a ring in contact, on the one hand, by its lower surface, with the sides of metallization 107, for example, all along the periphery of metallization 107, and on the other hand, by its outer surface, with the gate insulator layer 111 of the LED.

In operation, spacer 301 is at the same potential as anode contact metallization 107, which favors the forming of a hole conduction channel towards emissive layer 103 with respect to a structure of the type described in relation with FIG. 2 where the spacer is made of an insulating material.

The manufacturing of the LED 300 of FIG. 3 may comprise the successive steps of:
epitaxial deposition of successive layers 12, 101, 103, and 105 on the upper surface of support substrate 10;
deposition of a metal layer, for example, made of aluminum, over the entire upper surface of the stack, for the forming of the anode contact metallization 107 of the LED;
forming of hard mask 109 on the upper surface of the metal layer, opposite the active portion of the LED;
partial forming of trenches 110 by etching from the upper surface of the metal layer, down to the upper surface of semiconductor layer 105, to laterally delimit the anode contact metallization 107 of the LED;
forming of a conductive spacer 301, for example, made of metal, in contact with the sides of anode contact metallization 107, for example, all along the periphery of metallization 107 in this example, spacer 301 also extends on top of and in contact with the sides of hard mask layer 109;
extension of trenches 110 by dry etching, for example, by plasma etching, at least all the way to the upper surface of layer 101, to delimit the active portion of the LED during this step, the portions of layers 105, 103 and, optionally, 101, located under spacer 301 are not etched;
chemical cleaning of the surfaces of semiconductor layers 101, 103, and 105 exposed at the end of the dry etch step, for example, by means of a solution based on KOH, on TMAH, or on TEAH, or by means of any other solution capable of etching the III-N compound(s) forming layers 101, 103, and 105; and
deposition of gate insulator layer 111 and then of conductive gate layer 113 over the entire upper surface of the structure, that is, at the bottom and on the lateral walls of trench 110 and on the upper surface of contact metallization 107, in the active portion of the LED.

As in the example of FIGS. 1 and 2, gate insulator layer 111 is preferably deposited by a conformal deposition method, for example, by ALD. As an example, gate insulator layer 111 is selected to resist to an electric field of at least 10 MV/cm. As an example, layer 111 is made of alumina ($Al_2O_3$). As an example, the thickness of layer 111 is in the range from 2 to 100 nm.

Similarly to what has been described in relation with FIGS. 1 and 2, a step of local removal of layers 113, 111, and 109 opposite at least a portion of anode contact metallization 107 may be provided to allow the taking of an electric contact on metallization 107, for example, via a connection metallization 115.

Further, the cathode contact metallization of the LED (not shown in FIG. 3) may be formed similarly to what has been described in relation with FIG. 1.

In the example of FIG. 3, the forming of spacer 301 may comprise a step of non-local (full plate) deposition of a conductive material, for example, a metal, over the entire upper surface of the structure obtained at the end of the step of partial etching of trench 110. The conductive layer thus extends continuously over substantially the entire upper surface of the structure, that is, on the upper surface of hard mask layer 109, on the sides of hard mask layer 109 and of metallization 107, as well as on the upper surface of semiconductor layer 105 at the bottom of partial trench 110. The conductive layer may be deposited by a conformal deposition method to have a substantially uniform thickness all over the surface of the structure. The thickness of the conductive layer is for example in the range from 10 nm to 1 µm. After the deposition of the conductive layer, a step of non-local (full plate) vertical directional (anisotropic) etching of the conductive layer may be provided to remove the horizontal portions and only keep the vertical portions of the conductive layer. The etching implemented during this step is for example an IBE-type etching (ion beam etching) or an ICP-RIE-type etching (inductively coupled plasma reactive ion etch). At the end of this step, only the vertical portion of the conductive layer, coating the sides of anode contact metallization 107 and of hard mask layer 109 is kept, forming metal spacer 301.

The step of chemical etching of the exposed surfaces of semiconductor layers 105, 103, and 101 inside of trench 110 enables to remove the semiconductor material surface film possibly damaged during the step of dry etching of trench 110. Spacer 301 enables to protect the sides of anode contact metallization 107 during the chemical cleaning step. Preferably, the etching time is adapted so that the thickness of semiconductor material removed from the sides of the active portion of the LED is smaller than the thickness of spacer 301, to avoid reaching layer 107.

Spacer 301 may be made of a metal different from that of anode contact metallization 107. As an example, spacer 301 is a metal from the group comprising platinum, nickel, and tungsten, these metals having the advantage of not being, or of being little, etched by cleaning solutions based on KOH, on TMAH, or on TEAH. Preferably, spacer 301 is made of platinum, which has the additional advantage of forming a good electric contact with layer 105.

As a variant, the material of hard mask layer 109 may be a conductive material. In this case, connection metallization 115 does not need crossing the hard mask 109. As an example, connection metallization 115 only crosses layers 113 and 111 and is in contact, by it lower surface, with the upper surface of layer 109, the lower surface of layer 109 being in contact with the upper surface of metallization 107. As an example, hard mask 109 is made of the same conductive material as spacer 301.

Various embodiments and variants have been described. It will be understood by those skilled in the art that certain features of these various embodiments and variations may be combined, and other variations will occur to those skilled in the art. In particular, the described embodiments are not limited to the examples of materials and of dimensions mentioned in the present disclosure. More particularly, semiconductor layers 101, 103, and/or 105 may be made of semiconductor materials other than III-N compounds.

Further, although only examples of LED-type photo-emitting devices have been described hereabove, the described embodiments may also apply to PN junction photodetector devices, for example, photodiodes.

Further, the described embodiments are not limited to the specific example described in relation with FIG. 3, where the insulated conductive gate formed by the stack of layers 111 and 113 extends on the sides of the semiconductor layers 103 and 101 of the device. As a variant, the insulated conductive gate may coat only the lateral sides of spacer 301 and of semiconductor layers 105 and 103, or even only the lateral sides of spacer 301 and of semiconductor layer 105.

Further, embodiments where conductive gate 113 is electrically insulated not only from anode contact metallization 115, but also from the cathode contact metallization (not shown) have been described hereabove. As a variant, conductive gate 113 may be electrically insulated from anode contact metallization 115 but electrically connected to the cathode contact metallization. A field effect similar to what has been described hereabove can then be obtained, particularly for relatively high operating voltages, for example, beyond 5 volts.

What is claimed is:

1. Optoelectronic device comprising:
   a vertical stack of a first doped semiconductor layer of a first conductivity type, of a second doped semiconductor layer of a second conductivity type forming with the first doped semiconductor layer a PN junction, and of a third conductive layer arranged on top of and in contact with a surface of the second doped semiconductor layer opposite to the first doped semiconductor layer;
   a peripheral trench crossing the third conductive layer and the second doped semiconductor layer, said peripheral trench laterally delimiting a portion of the third conductive layer and a portion of the second doped semiconductor layer;
   in said peripheral trench, a conductive spacer made of metal and in contact with a lateral side of said portion of the third conductive layer; and
   in said peripheral trench, an insulated conductive gate comprising a gate insulator layer extending on top of and in contact with a lateral side of the conductive spacer and on top of and in contact with a lateral side of said portion of the second doped semiconductor layer, and a conductive gate layer arranged on top of and in contact with a surface of the gate insulator layer opposite to the conductive spacer and to said portion of the second doped semiconductor layer.

2. Device according to claim 1, wherein the conductive spacer is a material different from that of the third layer.

3. Device according to claim 2, wherein the conductive spacer is made of a metal from the group comprising platinum, nickel, and tungsten.

4. Device according to claim 1, wherein the third conductive layer is made of aluminum or of silver.

5. Device according to claim 1, further comprising a connection metallization in contact with the first doped semiconductor layer.

6. Device according to claim 5, wherein said connection metallization is electrically insulated from the insulated conductive gate.

7. Device according to claim 5, wherein said connection metallization is electrically connected to the insulated conductive gate.

8. Device according to claim 1, further comprising an emissive semiconductor layer between the first and second doped semiconductor layers, wherein the peripheral trench crosses the emissive semiconductor layer, said peripheral trench laterally delimiting a portion of the emissive semiconductor layer, and the insulated conductive gate extending against a lateral side of said portion of the emissive semiconductor layer.

9. Device according to claim 1, wherein each of the first and second dope semiconductor layers is made of a III-N compound.

10. Method of manufacturing an optoelectronic device according to claim 1, comprising the successive steps of:
   a) providing the stack comprising the first doped semiconductor layer, the second doped semiconductor layer, and the third conductive layer;
   b) forming the peripheral trench crossing the third conductive layer and stopping on the second doped semiconductor layer, said peripheral trench laterally delimiting said portion of the third conductive layer;
   c) forming in said peripheral trench the conductive spacer in contact with the sides of said portion of the third conductive layer;
   d) continuing said peripheral trench through the second doped semiconductor layer, said continued peripheral trench laterally delimiting said portion of the second doped semiconductor layer; and
   e) forming in said peripheral trench the insulated conductive gate.

11. Method according to claim 10, further comprising after step d) and before step e), a step of chemical cleaning of the exposed surfaces of the first doped semiconductor layer inside of the peripheral trench.

12. Method according to claim 11, wherein the step of chemical cleaning is carried out by means of a solution based on potassium hydroxide or of a solution based on tetramethylammonium hydroxide, or of a solution based on tetraethylammonium hydroxide.

* * * * *